United States Patent [19]

Needle

[11] Patent Number: 4,988,892

[45] Date of Patent: Jan. 29, 1991

[54] METHOD AND CIRCUIT FOR GENERATING DEPENDENT CLOCK SIGNALS

[75] Inventor: David L. Needle, Alameda, Calif.

[73] Assignee: Atari Corporation, Sunnyvale, Calif.

[21] Appl. No.: 361,020

[22] Filed: Jun. 2, 1989

[51] Int. Cl.$^5$ .......................... H03K 5/13; H03K 19/00
[52] U.S. Cl. ..................................... 307/269; 307/480
[58] Field of Search ................................. 307/269, 480

[56] References Cited

U.S. PATENT DOCUMENTS

| | | | |
|---|---|---|---|
| 4,115,706 | 9/1978 | Yamaguchi | 307/269 |
| 4,641,048 | 2/1987 | Pollock | 307/480 |
| 4,756,006 | 7/1988 | Rickard | 307/480 |
| 4,912,340 | 3/1990 | Wilcox et al. | 307/480 |

OTHER PUBLICATIONS

"TTL Clock Generator with Equal Mark/Space", New Electronics, Apr. 6, 1982, vol. 15, No. 7, P. Thompson.
"Clock Generator with Single-Oscillator-Edge Control", IBM Technical Disclosure Bulletin, vol. 30, No. 2, July, 1987.

*Primary Examiner*—Stanley D. Miller
*Assistant Examiner*—Richard Roseen
*Attorney, Agent, or Firm*—Michael L. Sherrard; Robert B. Chickering

[57] ABSTRACT

A method and circuit generate a dependent clock signal from a master clock signal with minimal skew of the dependent clock signal with respect to the master clock signal and inverting it to create a second master clock signal that is one hundred eighty degrees out of phase with the first master clock signal. The second master clock signal is used to drive a flip flop type circuit so that the flip flop circuit changes states when the first master clock signal is at a "zero" level and the second master clock signal is at a "one" level. The output of the flip flop circuit is enabled using the first master clock signal. Connected to the output of the tri-state driver is a repeater circuit of the type having an output that remains the same as the input until the input level is changed. The resulting dependent clock signal has a minimal skew with respect to the first master clock signal because the output of the flip flop circuit has become stable by the time the tri-state driver is enabled by the first master clock signal. Thus, the skew line is limited to the delay time of the tri-state driver.

5 Claims, 2 Drawing Sheets

METHOD AND CIRCUIT FOR GENERATING DEPENDENT CLOCK SIGNALS

BACKGROUND OF THE INVENTION

1. Field of the Invention

This invention relates to generating related timing signals that have a minimal time delay or skew with respect to a master clock signal. In particular this invention uses a tri-state buffer driven by the original master clock to lessen the skew between the resulting dependent clock and the master clock signal.

Description of the Prior Art

In the design of digital circuits there is usually a need to synchronize the clocking of many elements to a single master clock source. Many times, it is also necessary to clock a certain portion of the circuit at a rate that is different from, but still dependent on, a master clock source. Such dependencies could include ½ or ¼ the master rate or could be 1/n of the rate shifted by "m" periods of the master rate. The act of cresting such a dependent clock requires the use of flip flops and other logic which can cause a delay from the master clock signals, called a "skew", is sometimes unacceptable, especially in high speed electronic circuits. When the delay is not acceptable, the designer has to resort to other silicon methods to achieve the same logical events. This is commonly done by adding a multiplexer to every instance of logic that required a dependent clock. The multiplexer is activated with a signal that is appropriately related to the original clock. The master clock is usually used as the instance clock. While this system always works, it requires that a significant amount of silicon be added to the circuit.

What is needed, then, is a dependent clock generator that does not incur the delays associated with the logic that is used to create such a signal.

SUMMARY OF THE INVENTION

This invention uses tri-state drivers to set a clock line to a particular state and allows a repeater circuit that is connected to that clock line to hold it in its new state until the next time the tri-state driver changes the state of the line. An enable input to the tri-state driver is the original master clock and the data input is related to the desired dependent clock. This method allows the related dependent clock to be generated with little concern for the final timing skew generated by the logic creating the dependent clock and provides a final dependent clock signal that has a minimal skew with respect to the original master clock.

DETAILED DESCRIPTION OF THE INVENTION

Figure 1:
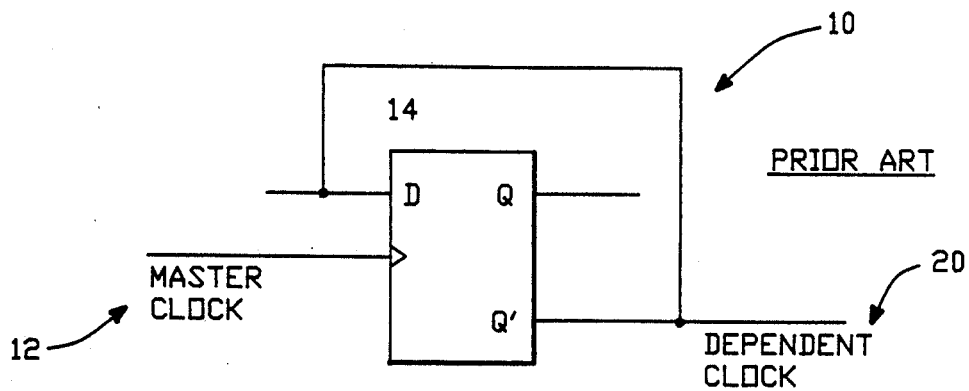
FIG. 1 shows a typical prior art circuit used to generate a dependent clock signal.

FIG. 1 depicts a common way of generating a dependent clock signal. Typically, a D-type flip flop 10 is configured such that the master clock 12 provides the clocking signal. The clock of the D-type flip flop in this case is shown as being positive edge triggered. The D input 14 is connected to the Q' output 16 so that on each rising edge of the master clock signal 12 the D-type flip flop 10 will change states.

Figure 2:
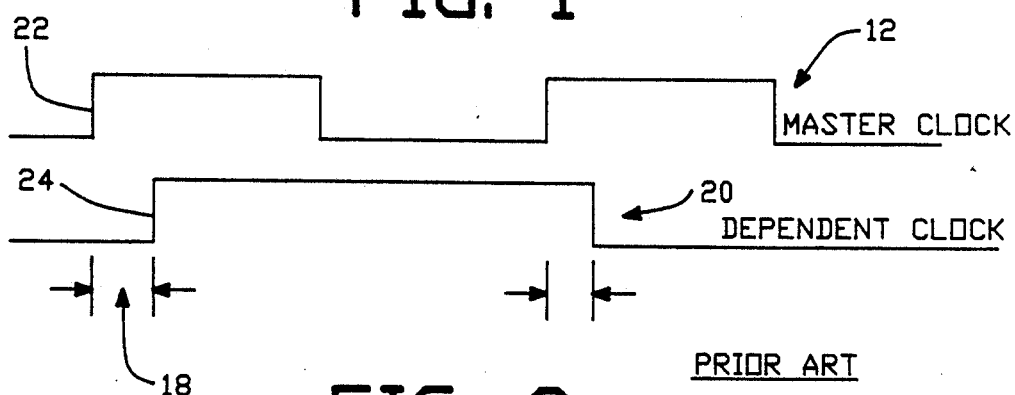
FIG. 2 shows a timing diagram and skew that accompany the circuit shown in FIG. 1.

The problem with using the circuit in FIG. 1 is shown graphically in FIG. 2. The delays that are inherent in the flip flop 10 cause a skew 18 to occur between the master clock signal 12 and the resulting dependent clock signal 20. The skew 18 is defined as the time delay between a leading edge 22 of the master clock signal 12 and the corresponding leading edge 24 of the dependent clock signal 20. Typically, the skew 18 is about eight (8) nano-seconds.

Figure 3:
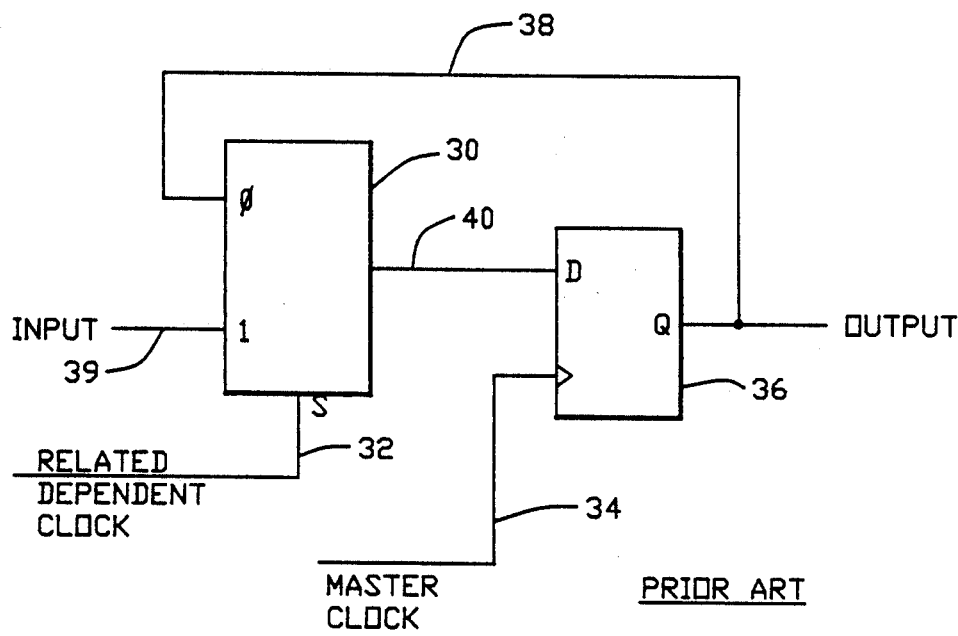
FIG. 3 shows a prior prior art multiplexer circuit often used to eliminate the skew that can accompany the circuit shown in FIG. 1.

In order to reduce the skew time or a related clock signal, circuit designers often employ the multiplexer circuit as shown in FIG. 3. In this circuit, the multiplexer 30 is activated with a signal on line 32 with a signal appropriately related to the original dependent clock and using the original master timing signal as the instance clock input on line 34 to D flip-flop 36. The input on line 39 is the "1" input to the multiplexer 30. The 9 output of the flip-flop on line 38 is the "zero" input to the multiplexer 30. The output of the multiplexer 30 on line 40 is the D input to flip-flop 36.

While the method of using multiplexers always works to reduce the skew between the master clock signal and the related dependent clock signal, the amount of extra circuitry needed tends to make the method impractical for large circuit layouts.

Figure 4:
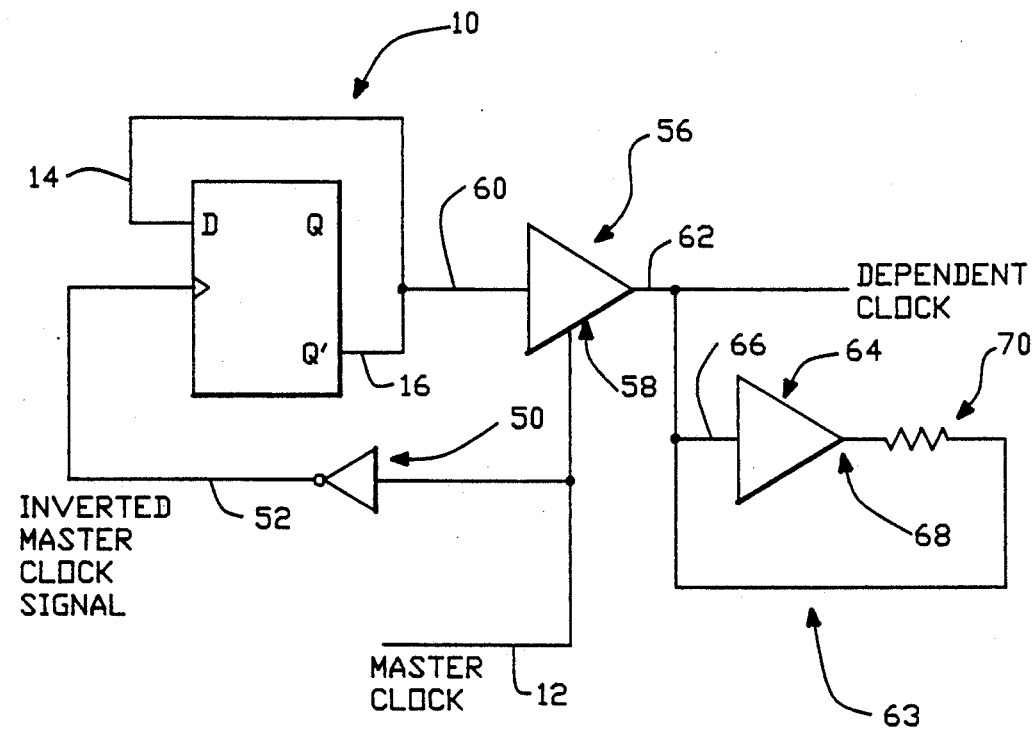
FIG. 4 shows a circuit in accordance with the present invention.

FIG. 4 shows a circuit that embodies the concept of the present invention. A master clock signal is applied to the input of an inverter 50. The output the inverter 50 is the master clock signal 12 inverted. The inverted master clock signal 52 can be used to drive any type of dependent clock generator, in this case a D-type flip flop 10 having the D input 14 connected to the Q' output 16. The output of the D-type flip flop Q' 16 is also connected to the input of a tri-state driver 56. The tri-state driver 56 is of the common variety that can produce a low voltage state or a high voltage state that corresponds to the input when the enable line is pulsed on. When the enable line 58 of the tri-state buffer is off, the output of the tri-state buffer 56 is in a high impedence state.

The enable line 58 of the tri-state buffer 56 as configured in the present invention is connected to the master clock signal 12. Thus, when the master clock signal 12 changes to a "on" level, whatever voltage is applied to the input line 60 appears on the output line 62. When the master clock signal 12 is at a "zero" level, the output line 62 of the tri-state driver 56 is in a high impedance state. Connected to the output line 62 of the tri-state driver 56 is a repeater circuit shown generally at 63. The repeater circuit 63 comprises a line driver 64 having an input line 66 and an output line 68. The input line 66 of the line driver 64 is connected to the output line 62 of the tri-state driver 56. The output line 68 of the repeater circuit 63 is connected to the input line 66 of the line driver 64 through a resistor 70.

Figure 5:
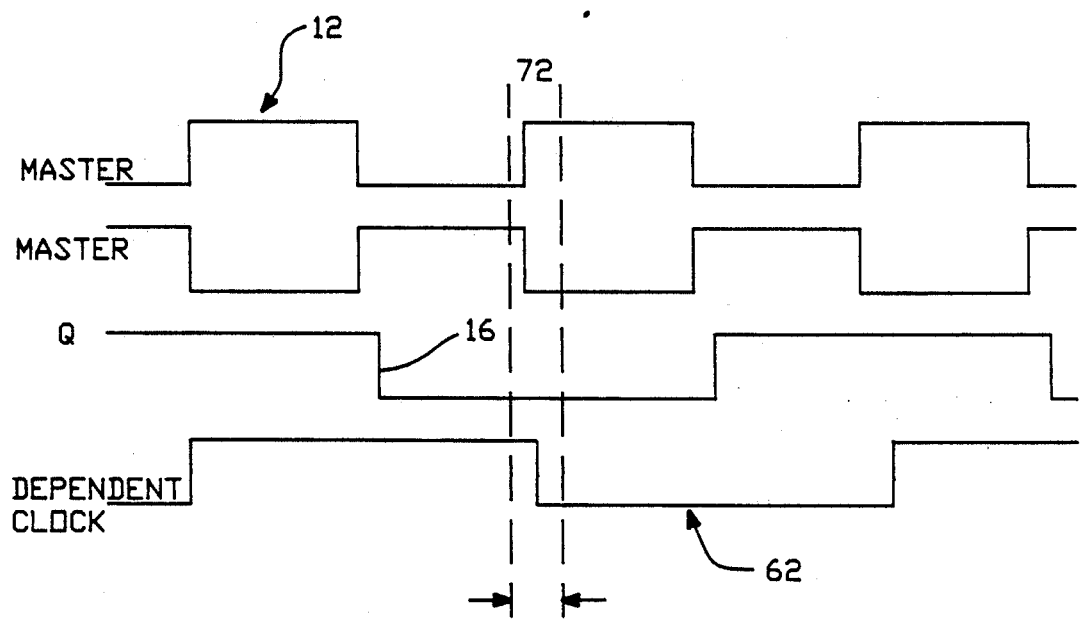
FIG. 5 shows a timing diagram useful for understanding operation of the circuit in FIG. 4.

The purpose of the repeater circuit 63 is to maintain a high or low voltage state when the output line 62 of the tri-state buffer 56 is in a high impedance state. The repeater circuit 63 will maintain a high voltage or a low voltage on the output line 62 of the tri-state buffer until such time as the output line 62 of the tri-state buffer changes from a high impedance state to a low voltage state or a high voltage state. For example, if the output line 62 of the tri-state driver 56 is at a high voltage rate, then the repeater circuit will keep a high voltage state on the output line 62 even when the output line 62 of the tri-state driver is in the high impedence state. Once the enable line 58 of the tri-state driver 56 is turned on, the output line 62 will change states. If the output line 62 changes from a high voltage state to a low voltage state, the repeater circuit will change its output to a low voltage state. FIG. 5 shows the timing relationship between the master clock signal 12 and the resulting dependent clock signal 62 which is the same as the voltage on the output line 62 of the tri-state driver 56. Because the dependent clock generator 10 is clocked by the inverted master clock signal 52, the output Q' 16 is changing states when the master clock signal is at a "zero" level. By the time the master clock signal changes states from "zero" to "one" the output Q' 16 has been stable for some time. Thus the only delay 72 between the master clock signal 12 and the dependent clock signal 62 is the delay that is inherent in the tri-state driver 56. It is possible using fast tri-state drivers to reduce the delay from time the enable line 58 is turned on to the time the output line 62 changes states to about two (2) nanoseconds. By clocking the dependent clock generator 10 with the inverted master clock signal 52 and by using the tri-state driver it is possible to significantly reduce the skew between the master clock signal 12 and the corresponding dependent clock signal 62.

Although the present invention has been described with reference to preferred embodiments, workers skilled in the art will recognize that changes may be made in form and detail without departing from the spirit and scope of the invention.

What is claimed is:

1. A circuit for generating a dependent clock signal from a master clock signal with a minimal skew of the dependent clock signal - with respect to the master clock signal, which comprises:

a source of the master clock signal, an inverter having an input line and an output line, the input line being connected to said source of the master clock signal, means for generating a dependent clock signal, having a clocking input line and an output line, the clocking input line being connected to the output of the inverter, a tri-state driver having an input line, an enable line and an output line, the output line being capable of producing a low voltage state, a high voltage state and a high impedence state, the input line of the tri-state driver being connected to the output line of the means for generating a dependent clock signal and the enable line being connected to the master clock signal, and a repeater circuit having an input line and an output line, wherein the input line and the output line of the repeater circuit is connected to the output line of the tri-state driver, wherein said circuit generates a dependent clock signal with minimal skew by driving the means for generating dependent signal with the output of the inverter and enabling the tri-state buffer with the master clock signal; the output line of the means for generating a dependent clock signal being stable by the time the enable line of the tri-state buffer is activated by the master clock signal, thereby reducing the skew between the master clock signal and the dependent clock signal to the delay of the tri-state driver.

2. A circuit is defined in claim 1, wherein the means for generating a dependent signal comprises a D-type flip flop having a D input, and a Q' output, wherein the D input is connected to the Q' output.

3. A circuit as defined in claim 2, wherein the input line of the tri-state driver is connected to the Q' output of the D-type flip flop.

4. A circuit as defined in claim 1, wherein the repeater circuit comprises a driver having an input and an output line, wherein the input line of the repeater circuit is connected to the output line of the repeater circuit through a resistor.

5. A method of generating a dependent clock signal from a master clock signal with minimal skew of the dependent clock signal with respect to the master clock signal, which comprises:

providing a first master clock signal which alternates between a "zero" level and a "one" level, inverting the first master clock signal to create a second master clock signal that is 180 degrees out of phase with respect to the first master clock signal, driving a flip flop circuit with the second master clock signal, wherein the flip flop circuit is of the type having an output that can remain in either a "one" state or a "zero" state, the output of the flip flop changing states when the second master clock signal changes from a zero level to a one level, enabling a tri-state driver, with the first master clock signal, wherein the tri-state driver is of the type having an input coupled the output of the flip flop circuit and an output that can remain in either a low state, a high state or a high impedance state, and connecting to the output of the tri-state driver a repeater circuit of the type having an input level and an output level such that the output level remains the same as the input level until the input level is changed.

* * * * *